(12) United States Patent
Vo et al.

(10) Patent No.: US 9,570,135 B2
(45) Date of Patent: Feb. 14, 2017

(54) APPARATUSES AND METHODS TO DELAY MEMORY COMMANDS AND CLOCK SIGNALS

(71) Applicant: Micron Technology, Inc., Boise, ID (US)

(72) Inventors: Huy T. Vo, Boise, ID (US); Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 14/174,405

(22) Filed: Feb. 6, 2014

(65) Prior Publication Data

US 2015/0221355 A1    Aug. 6, 2015

(51) Int. Cl.
*G11C 7/10* (2006.01)
*G11C 7/22* (2006.01)
*G11C 8/18* (2006.01)

(52) U.S. Cl.
CPC ............. *G11C 8/18* (2013.01); *G11C 7/109* (2013.01); *G11C 7/1093* (2013.01); *G11C 7/222* (2013.01)

(58) Field of Classification Search
CPC ....... G11C 7/109; G11C 7/1093; G11C 7/222; G11C 8/18
See application file for complete search history.

(56) References Cited

U.S. PATENT DOCUMENTS

| | | | |
|---|---|---|---|
| 2001/0028599 A1* | 10/2001 | Aikawa | 365/233 |
| 2006/0044033 A1* | 3/2006 | Kim | 327/158 |
| 2011/0069523 A1* | 3/2011 | Kuroda | 365/63 |
| 2013/0182516 A1* | 7/2013 | Kinoshita | 365/194 |
| 2014/0015575 A1* | 1/2014 | Jung | 327/156 |

\* cited by examiner

*Primary Examiner* — David B. Lugo
(74) *Attorney, Agent, or Firm* — Dorsey & Whitney LLP (57) ABSTRACT

An example delay circuit may include a delay block configured to receive a command signal and/or a bank address signal, a first clock signal, and a second clock signal and further configured to add an intrinsic delay to the command signal or the bank address signal and add a forward path delay greater than the intrinsic delay to the first and second clock signals.

24 Claims, 6 Drawing Sheets

APPARATUSES AND METHODS TO DELAY MEMORY COMMANDS AND CLOCK SIGNALS

BACKGROUND

This invention relates generally to high speed semiconductor memory, and more specifically to methods and apparatus for reducing layout space, power consumption and noise reduction related to delay lines for command paths. Semiconductor memories typically include an array of memory cells, address decoding circuitry for selecting one of or a group of the memory cells for reading or writing data, sensing circuitry for detecting the digital state of the selected memory cell(s), and input/output lines to receive the sensed data and convey that information for eventual output from the semiconductor memory. Synchronous memories receive and deliver data coincident with a clock signal. Conventionally, an external clock signal is received by the device. Input signals and data are received synchronized with the external clock signal. Due to internal delays associated with the components of the memory, the phase of the external clock signal is shifted within the memory. Timing control circuits, such as delay-locked loops (DLLs) or phase locked loops (PLLs), may be provided for synchronizing the output signals and the output strobe signals with the provided external clock signal.

The timing control circuits may also be utilized by the memory due to the memory internally operating at a different clock rate than that of the external clock signal. An internal clock signal of the memory may be based on the external clock signal, half the external clock rate for example. Because the memories may operate at a clock rate that is slower than the external clock rate, commands received by the memory may be broken up and processed in parallel so that output of the memory is synchronized with the external clock and released onto output lines at an expected time. For example, an external component may request a read command from the memory and expect to receive the data at a certain number of external clock cycles after sending the command, e.g., 8 external clock cycles. Due to the break up and parallel operation of the command, however, the data may be accessed in less than 8 external clock cycles even though the memory is operating at half that rate. To ensure the data is buffered onto the output lines at the anticipated time, the timing control circuit may include internal delays that slow down the access and/or release of the data.

The internal delays may occur in various circuits of the memory, such as a DLL. The DLL may delay command signals, and the internal and external clock signals of the memory. By implementing the DLL on both the command signals and clock signals, the DLL may ensure that all those associated signals for a command are commensurately delayed so that the output is placed on the output lines at the correct time. Delaying all of those signals, however, may require additional on-die real estate since the command path may need 20 to 40 delay line replicas. In addition to the on-die real estate consumed by the delay line replicas, the power consumption may increase along with signal noise.

DETAILED DESCRIPTION

One or more specific embodiments of the disclosed subject matter are described below. It is specifically intended that the disclosed subject matter not be limited to the embodiments and illustrations contained herein, but include modified forms of those embodiments including portions of the embodiments and combinations of elements of different embodiments as come within the scope of the following claims.

Embodiments of the disclosed subject matter are described with reference to the attached figures. Various structures, systems and devices are schematically depicted in the drawings for purposes of explanation only and so as to not obscure the embodiments of the disclosed subject matter with details that are well known to those skilled in the art. Nevertheless, the attached drawings are included to describe and explain illustrative examples of embodiments of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. Nothing in this application is considered critical or essential to the disclosed subject matter unless explicitly indicated as being "critical" or "essential."

The memory discussed above may be a part of a computer or electronics system and the system may also include a system clock used as a reference for interactions between components of the system. The various components of either system may send commands to the memory, such as read or write commands, and these commands may arrive based on the clock rate of the system clock. The commanding components may expect the data, associated with a read command for example, to be available on the system bus according to a latency, that is, after a certain number of clock cycles of the system clock, 8 for example. As such, with a latency of 8, the component will expect data on the $8^{th}$ clock cycle after sending the command. The memory, regardless of its internal clock rate (which may not be the same as the system clock rate), strobes the requested data onto output lines and the system bus at the correct time. The commanding component may provide data, associated with the write command for example, to the memory according to a write latency, that is, a certain number of clock cycles of the system clock after the write command is received, for example, 10 clock cycles. In order for the memory to place the data on its outputs or to receive the data on its inputs at the correct time, the memory may keep track of the system clock while processing the command and associated address data.

The memory may have functional internal blocks/circuitry for timing the release of the data with the expected system clock cycle. The functional timing blocks may perform several tasks and may delay the propagation of the command signal, an associated address signal and the system clock signal to ensure the release or receipt of the data with the correct timing. Additionally, an internal reference clock that is based on the system clock may be generated by the memory. The various signals (command, BA, external clock, and internal clock) may all experience delay as they propagate through the memory to synchronize the data output and input with the expected clock cycle.

As noted above, the on-die real estate, power consumption and signal noise may all be increased when delay circuitry is used for the command, bank address (BA), internal clock and external clock signals. If the memory has 20 or more, and possibly up to 40, command lines, the delay circuitry may require additional die space, the layout of the conductive lines becomes more involved and may add to noise in the signals, and the power to drive each of the lines is additive to the power consumed by the memory. One solution to reduce these issues with respect to the command and/or BA lines may be to eliminate some of the delay circuitry thereby reducing real estate and power requirements and reducing noise.

Figure 1:
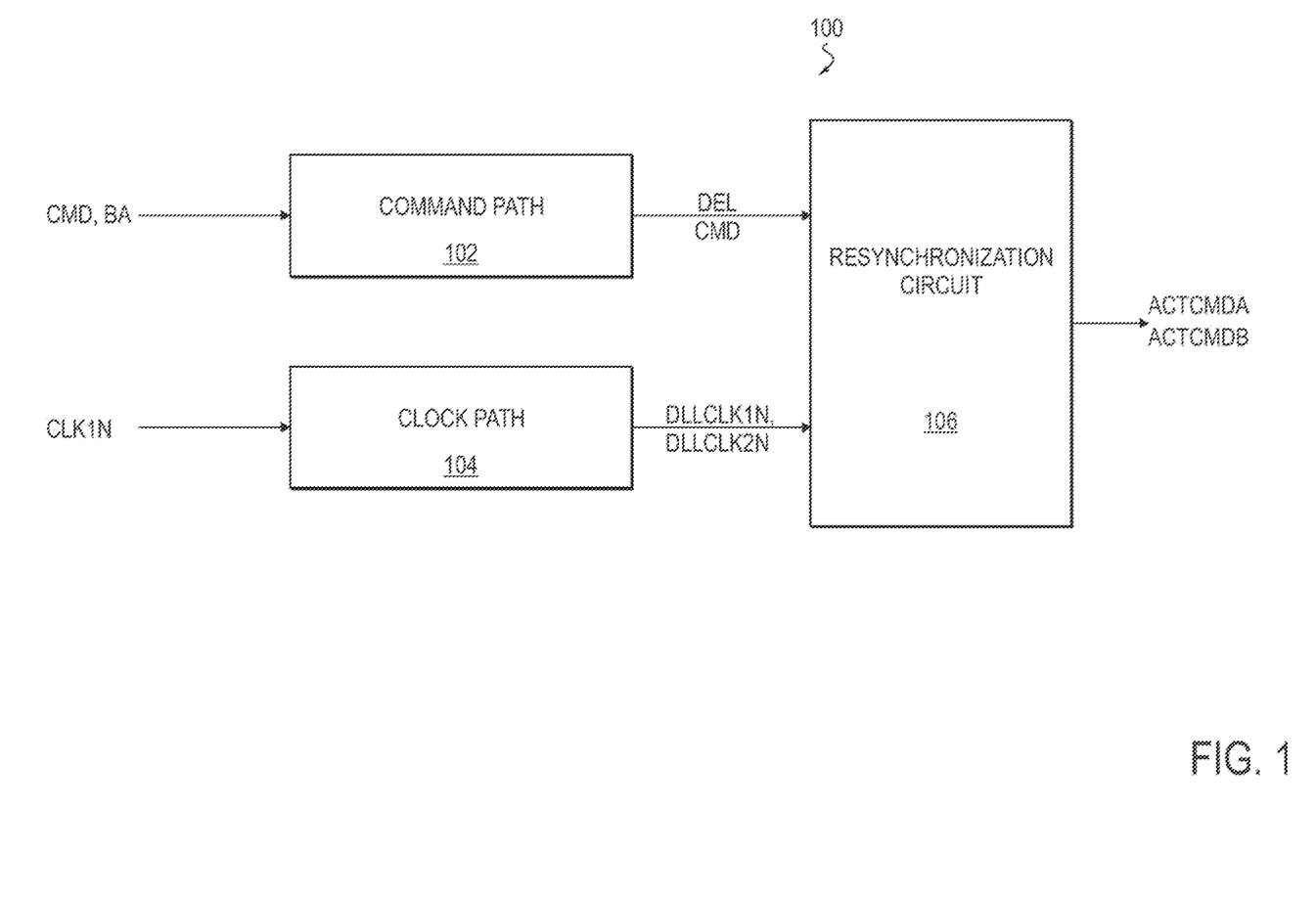
FIG. 1 is a simplified block diagram of a timing circuit according to an embodiment as discussed herein.

Referring now to the drawings wherein like reference numbers correspond to similar components throughout the several views. FIG. 1 shows a simplified block diagram of a timing circuit 100 in accordance with the disclosure as discussed herein. The timing circuit 100 may be included in a memory and may delay the propagation of the command/BA and/or clock signals to provide signals for internal operations of the memory.

The timing circuit 100 includes a command path 102, a clock path 104, and a resynchronization circuit 106. The command path 102 receives a command from an external component, for example, a read command, and may also receive a BA. As discussed herein, the term command may imply both the command and an associated BA and any use of command without referring to a BA within this disclosure is done for the sake of brevity and does not imply that only the command and/or command path is the focus. The command path 102 may delay the command by an amount of delay and provide a delayed command for accessing the memory location, preparing the data for output, and providing the data associated with the command. For example, the command path 102 may delay the signals to provide read data with a timing to satisfy a latency setting. An output of the command path 102 may be a delayed command DELCMD and/or a delayed BA. One of ordinary skill in the art would recognize that addresses associated with the commands are also contemplated.

The clock path 104 may delay the clock signal(s) in a similar fashion as the command path 102 delays the CMD/BA. The clock path 104 may receive the external clock as an input and provide an internal clock based on the external clock. The internal clock, for example, may have a period twice that of the external clock. For ease of description, the external clock may be referred to herein as CLK1N, where the 1N refers to the period of the system clock. Additionally, the internal clock may be referred to herein as CLK2N, where the 2N refers to the period of the internal clock being twice that of the external clock. The division of the external clock cycle by two is only used herein as an example and should not be construed as a limitation of the disclosure. The output of the clock path 104 may then be a delayed clock signal DLLCLK1N having a period of the external clock signal and a delayed clock signal DLLCLK2N having a period twice the external clock signal. Additionally, the two clock signals may be aligned to each other by the clock path 104 so that they are aligned at output.

The outputs of the command path 102 and the clock path 104 may be provided to the resynchronization circuit 106. The resynchronization circuit is configured to synchronize the delayed clock signals DLLCLK1N and DLLCLK2N with the delayed command signal DELCMD and a delayed BA signal (not shown), and provide activation signals ACTCMDA and ACTCMDB, that may be used to strobe output drivers of the memory so that the requested data is output to the lines according to the latency.

Figure 2:
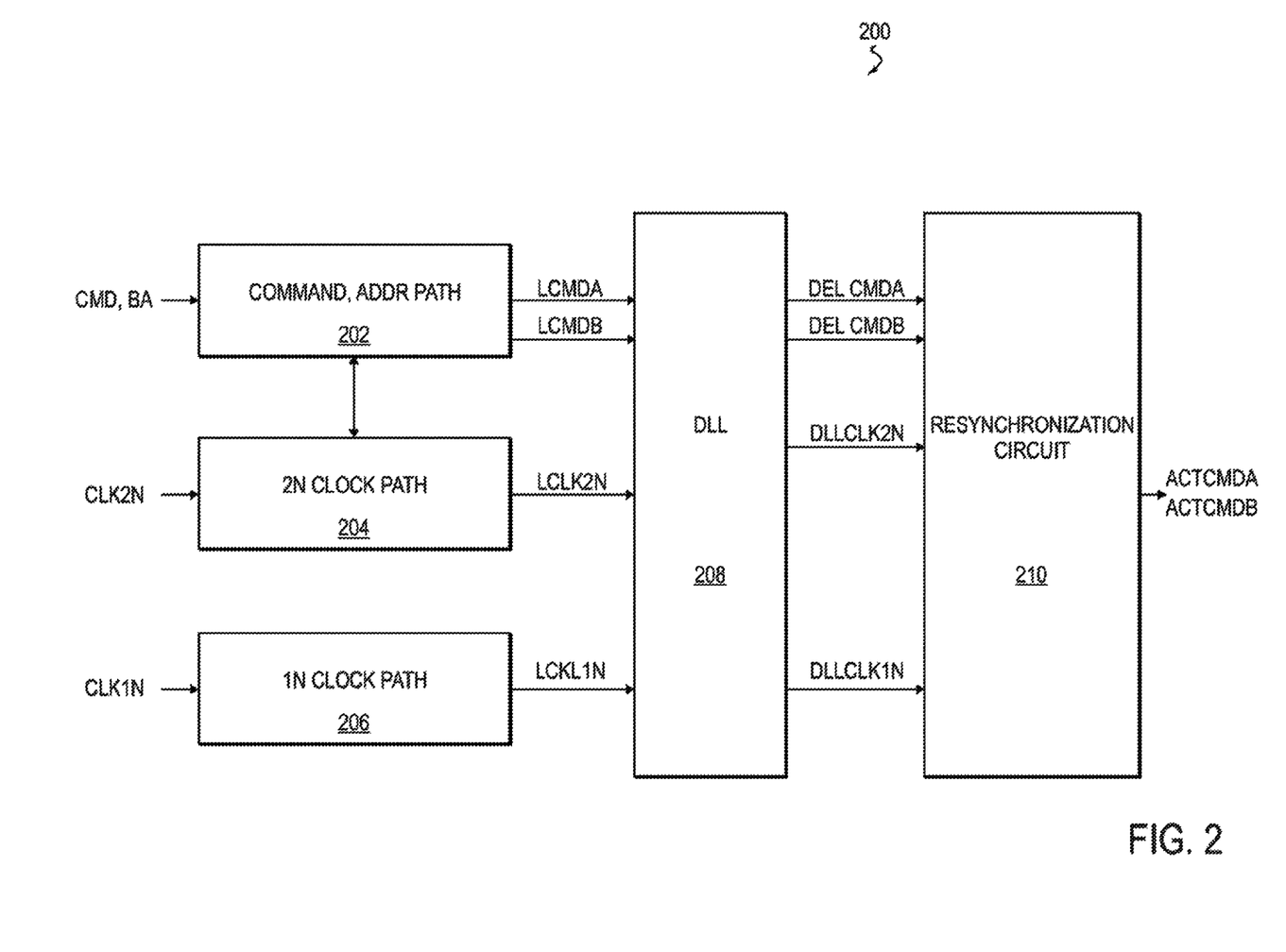
FIG. 2 is another simplified block diagram of the timing circuit according to an embodiment as discussed herein.

FIG. 2 shows another example block diagram of a timing circuit 200 of a memory in accordance with the disclosure as discussed herein. The timing circuit 200 is configured to delay command, BA and clock signals to provide or receive data according to a latency, for example, at a number of clock cycles anticipated by a requesting component and similar to the examples discussed above. The timing circuit 200 includes a command path 202, a 2N CLK clock path 204, a 1N CLK clock path 206, a delay block 208 and the resynchronization circuit 210. The command path 202, the 2N CLK clock path 204 and the 1N CLK clock path 206 are coupled to the delay block 208, which is coupled to the resynchronization circuit 210. The inputs to the timing circuit 200 may be a command signal CMD, a bank address signal BA, a CKL2N signal and a CLK1N signal. The frequency of the CLK2N signal may be less than the frequency of the CLK1N signal, as discussed above. The output of the timing circuit 200 may be one or more activation signals, ACTCMDA and ACTCMDB.

The command path 102 may provide multiple signals, LCMDA and LCMDB signals for example, based on the CMD signal, and LBA signals (not shown). The BA signals may be processed by the components of FIG. 2 similarly to how the CMD signals are processed and are not explicitly discussed or shown in the Figure in the interests of brevity and clarity. The LCMDA and LCMDB signals provided by the command path 202 may be active (e.g., have a high logic level) responsive to the CMD signal for a time equal to the period of the CLK2N signal. For example, based on a CMD signal, the command path 102 may provide a LCMDA signal having a high logic level equal to the period of the CLK2N signal and further provide a LCMDB signal having a high logic level equal to the period of the CLK2N signal. In providing the LCMDA and LCMDB signals, the command path 202 may also delay the CMD signal by an amount indicative of the delay needed to output or receive the data according to the expected latency.

The 2N CLK clock path 204 may delay the CLK2N signal commensurately with the CMD signal to provide a LCLK2N signal. Further, the 2N CLK clock path 204 may be coupled to the command path 202 so that the command path 202 may be provided a clock reference for providing LCMDA and LCMDB signals having active times equal to the period of the CLK2N signal. Similarly, the 1N CLK path 206 may delay the CLK1N signal commensurately with the delay the CMD signal incurs to provide a LCLK1N signal. The LCMDA and LCMDB signals provided by the command path 202, and the LCLK2N and LCLK1N signals provided by the 2N CLK clock path 204 and the 1N CLK clock path 206, respectively, may be edge aligned, to have synchronized signal transitions (e.g., the signal transitions from a high level to a low level, or the signal transitions from a low level to a high level). The edge aligned signals are provided to the delay block 208.

FIG. 2 shows three separate delay paths, but similarly with FIG. 1, two or more of the depicted paths may be combined. For example, the 2N CLK clock path 204 may be combined with the command path 202. Alternatively, the two clock paths may be combined into a single clock path.

The delay block 208 may be coupled to the command path 202, the 2N CLK clock path 204 and the 1N CLK clock path 206. The delay block 208 may be configured to delay the LCMDA and LCMDB signals by an amount of delay that is intrinsic to the delay block 208 and provide DELCMDA and DELCMDB signals, respectively. The delay block 208 may be further configured to delay the LCLK2N and LCLK1N signals to provide DLLCLK2N and DLLCLK1N signals, respectively. The delay provided to the LCLK2N and LCLK1N signals may be a forward path delay, which may include the intrinsic delay plus some additional amount of delay. The LCKL2N and LCLK1N signals may be delayed to provide a signal timing so that data is provided or received according to a latency. The "DEL" and "DLL" designations of the signals provided by the delay block 208 have been used to show that delay has been added to the respective signals by the delay block 208, but that the delay added to the command signals LCMDA and LCMDB is different than the delay added to the clock signals LCLK2N and LCLK1N. This difference will be further explained below. Further, the delay block 208 may align the DLLCLK2N and DLLCLK1N signals but the two clock signals may not be aligned to the command signals DELCMDA and DELCMDB. The DELCMDA and DELCMDB signals and the DLLCLK2N and DLLCLK1N signals may be provided by the delay block 208 to the resynchronization circuit 210. The resynchronization circuit 210, which functions similarly to the resynchronization circuit 106 as described above, provides the ACTCMDA and ACTCMDB signals.

Figure 3:
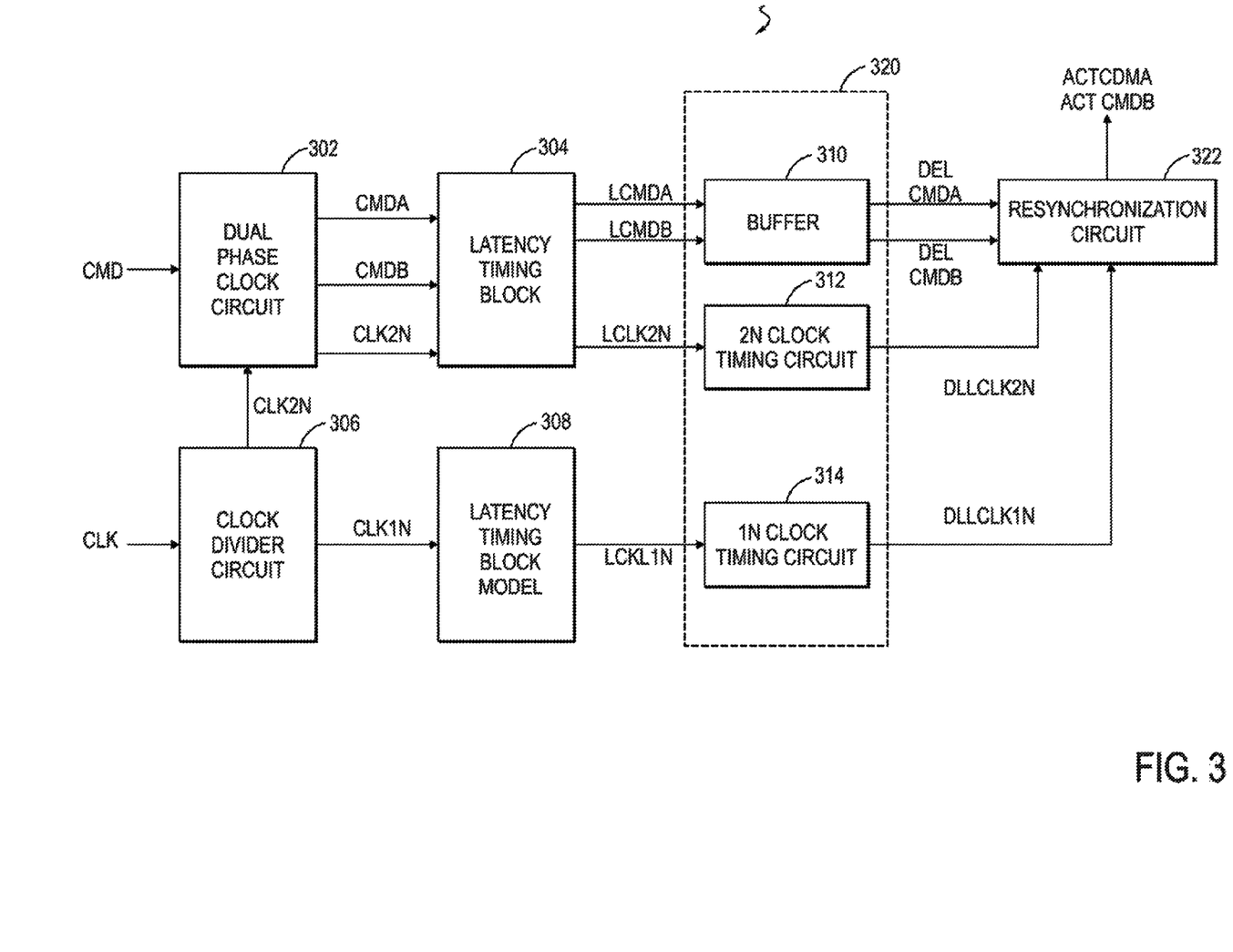
FIG. 3 is an example block diagram of the timing circuit according to an embodiment as discussed herein.

FIG. 3 shows an example block diagram of a timing circuit 300 in accordance with the disclosure discussed herein. The timing circuit 300 may be included in a memory and is configured to delay command, BA, and various clock signals to provide or receive data according to a latency. The timing circuit 300 may receive a CMD signal from an external component requesting data, for example. As discussed with regards to FIGS. 1 and 2, the CMD signal may be accompanied by an associated BA signal, which would be treated similarly is/as are the CMD signal(s). Additionally, the timing circuit may receive an external or system clock. The timing circuit 300 may include a dual phase clock circuit 302, a latency timing block 304, a clock divider circuit 306, a latency timing block model 308, a delay block 320 and a resynchronization circuit 322.

The clock divider circuit 306 may receive the CLK signal as an input and may be coupled to the dual phase clock circuit 302 and the latency timing block model 308. The clock divider circuit 306 may provide a second clock signal CLK2N, which may be based on the CLK signal. For example, the frequency of the CLK2N signal may be half that of the CLK signal. The CLK signal may be divided by two to provide the CLK2N signal. The clock divider circuit 306 may then provide the CLK2N signal to the dual phase clock circuit 302 and may provide a CLK1N signal to the latency timing block model 308. The CLK signal and the CLK1N signal may have the same frequency. The "1N" and "2N" labels are used to designate that the 2N signal is based on a clock cycle of the CLK signal and the 1N label is used to designate that the clock cycle is similar to the CLK signal.

The CLK2N signal provided by the clock divider circuit 306 may be used by the memory as the internal clock reference for processing read and write commands. That is, a derivative, for example, the system clock cycle divided by two, may be used as an internal timing reference by the memory. The timing circuit 300 may also propagate the CLK1N signal through the memory so that the CLK1N signal may be used in the timing circuit 300. The latency timing block model 308 may be configured to delay the CLK1N signal an amount of time that corresponds to the delay experienced by the CMD and CLK2N signals as they propagate through the dual phase clock circuit 302 and the latency timing block 304. The latency timing block model 308 may be coupled to the delay block 320 and may provide a delayed CLK1N signal LCLK1N.

The dual phase clock circuit 302 may receive the CMD signal as an input and provide internal command signals CMDA and CMDB. The dual phase clock circuit 302 may be coupled to the clock divider circuit 306 and the latency timing block 304. The dual phase clock circuit 302 may be configured to receive the CLK2N signal from the clock divider circuit 306 and use the CLK2N signal to provide active CMDA and CMDB signals having an active time (e.g., having a high logic level) equal to the period of the CLK2N signal. The CLK2N signal may be indicative of the internal timing of the memory. Additionally, as previously discussed, the dual phase clock circuit 302 may provide signals CMDA and CMDB, which may each have active times based on the CLK2N clock cycle rate. The CM DA and CMDB signals may be out of phase with each other by one clock cycle, for example. Further, the dual phase clock circuit 302 may align the CMDA, CMDB, and CLK2N signals upon output.

The latency timing block 304 receives the CMDA, CMDB, and the CLK2N signals from the dual phase clock circuit 302. The latency timing block 304 is further coupled to the delay block 320. The latency timing block may be configured to delay various signals having a timing to satisfy a latency setting, for example, to provide or receive data according to the latency. Using an example illustrated above, if the external component requests data and expects that data to be provided by the memory in 8 clock cycles of the CLK signal, but the memory is able to access and prepare the data to be provided in less than 8 clock cycles, 6 clock cycles for example, then the latency timing block 304 may delay the signals by all or some of the difference, e.g., 2 clock cycles. The latency timing block 304 may provide latency delayed command signals LCMDA and LCMDB, and latency clock signal LCLK2N. The LCMDA, LCMB, and LCLK2N signal may be aligned by the latency timing block 304.

The combination of the dual phase clock circuit 302 and the latency timing block 304 may be included in a command and timing path, for example, the command and timing path 102. Additionally, the clock divider circuit 306 may be included in a clock path, for example, the 2N CLK clock path 202. The combination of the clock divider circuit 306 and the latency timing block model 308 may be included in a clock path, for example, the clock path 104 and/or the 1N CLK clock path 204. The LCMDA and LCMDB signals provided by the latency timing block 304 and the LCLK1N signal provided by the latency timing block model 308 may be aligned before being provided to the delay block 320.

The delay block 320 may be coupled to the latency timing block 304 and the latency timing block model 308. The latency timing block 304 provides the LCMDA, LCMDB, and LCLK2N signals to the delay block 320, and the latency timing block model 308 provides the LCLK1N signal to the delay block 320. The delay block 320 may include a buffer 310, a 2N CLK timing circuit 312, and a 1N CLK timing circuit 314. As noted above, the delay block 320 is configured to delay the command and clock signals by various amounts of delay. The LCMDA and LCMDB signals are delayed by the buffer 310 to provide DELCMDA and DELCMDB signals, respectively. The two clock signals LCLK2N and LCLK1N, however, may be commensurately delayed so that the delay block 320 provides clock signals DLLCLK2N and DLLCLK1N in an aligned manner. The DLLCLK2N and DLLCLK1N signals may or may not be aligned to the DELCMDA and DELCMDB signals provided by the delay block 320.

The buffer 310 may represent an intrinsic amount of delay the command signals LCMDA and LCMDB experience as they propagate through the delay block 320. For example, the buffer 310 may be a DLL delay block model. Other than the delay of the buffer 310 provided to the command signals, the delay block 320 does not add any further delay to the LCMDA and LCMDB signals in providing the DELCMDA and DELCMDB signals.

The 1N CLK timing circuit 314 may add delay to the LCLK1N signal to provide a DLLCLK1N signal. The delay added by the 1N CLK timing circuit 314 includes the intrinsic delay associated with the delay block 320. The delay added by the 1N CLK timing circuit 314 may further include delay to provide the DLLCLK2N signal with the desired timing to satisfy a latency, for example, to account for any small differences between the anticipated time the data is to be output and the execution of the command by the memory. The additional time may be based on feedback that at least partially accounts for any further downstream paths/processing the clock signal may experience. The 1N CLK timing circuit 314 may include conventional clock circuits, for example, delay locked loops, phase locked loops, synchronous mirror delays, and other clock circuits as well.

The 2N CLK timing circuit 312 may also add delay to the LCLK2N signal to provide a DLLCLK2N signal. The delay added by the 2N CLK timing circuit 312 may be the same amount of delay added by the 1N CLK timing circuit 314 to the LCLK1N signal. For example, the 2N CLK timing circuit 312 may include an adjustable delay line that is adjusted to provide the same delay as an adjustable delay line included in the 1N CLK timing circuit 314. In some embodiments, the 2N CLK timing circuit 312 may include a replica of an adjustable delay included in the 1N CLK timing circuit 314 that is adjusted by the same control signals. In some embodiments, the 2N CLK timing circuit 312 includes a conventional clock circuit. By adding the same amount of delay to the LCLK2N signal as added to the LCLK1N signal, the two CLK timing circuits may align the two clock signals DLLCLK1N and DLLCLK2N.

The DELCMDA and DELCMDB signals provided by the buffer 310, and the DLLCLK2N and DLLCLK1N signals provided by the 2N CLK timing circuit 312 and the 1N CLK timing circuit 314 are provided to the resynchronization circuit 322. As previously described, the two clock signals DLLCLK1N and DLLCLK2N may be aligned. However, two clock signals may not be aligned to the two command signals DELCMDA and DELCMDB. The resynchronization circuit may be configured to latch the two command signals on a rising edge of the DLLCLK2N and then provide the command signals ACTCMDA and ACTCMDB to the circuitry in a data path, for example, output drivers/buffers so that data is provided or received according to a latency setting.

Figure 4:
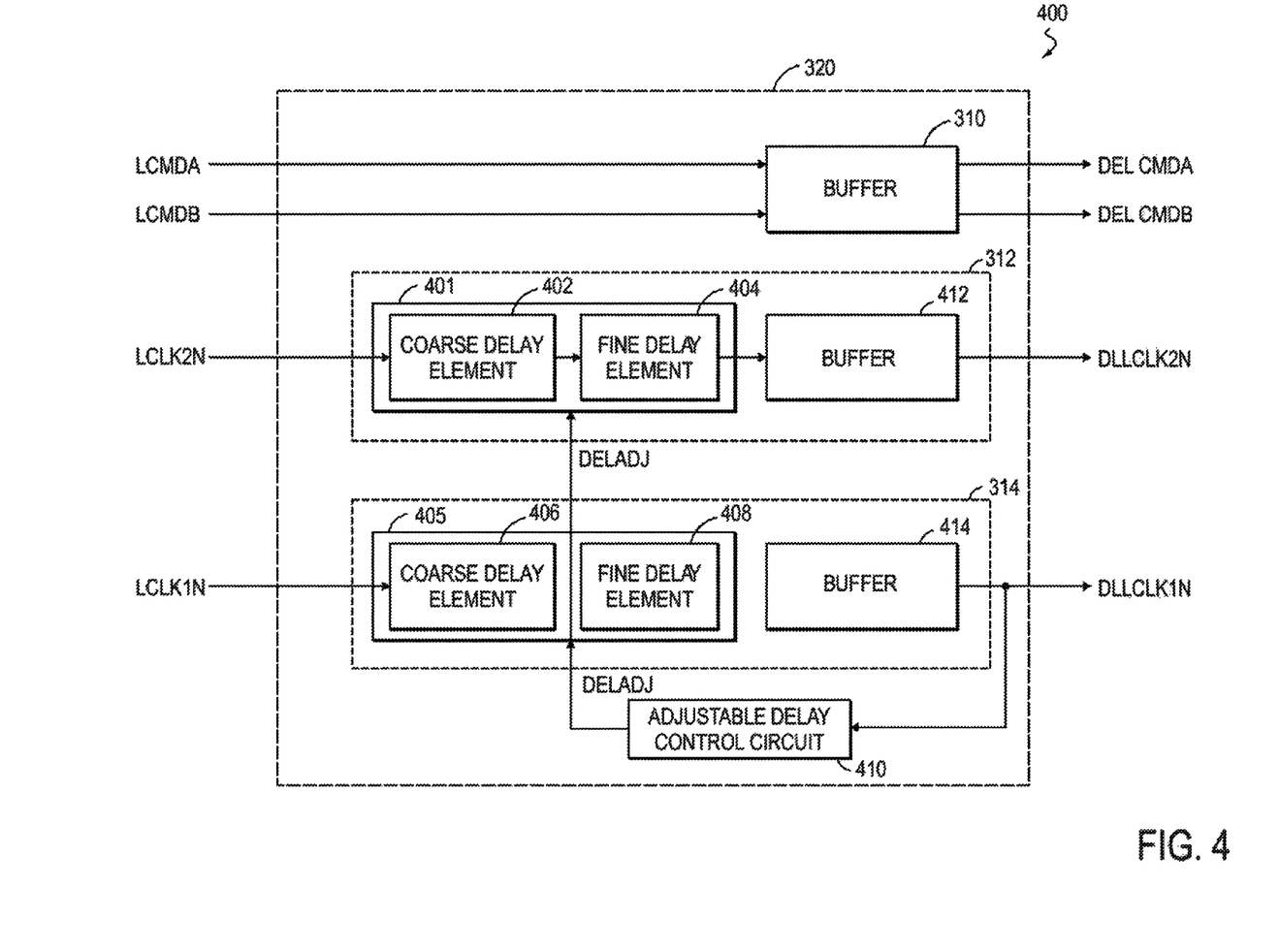
FIG. 4 is a simplified block diagram of a delay block according to an embodiment as discussed herein included in the timing circuit of FIG. 3.

FIG. 4 shows an example block diagram of the delay block 320 shown in FIG. 3 and in accordance with the disclosure discussed herein. The delay block 320 includes the buffer 310, 2N CLK timing circuit 312, and 1N CLK timing circuit 314. The 1N CLK timing circuit 314 includes an adjustable delay 405, which may include an adjustable coarse delay 406, and an adjustable fine delay 408. Further, the 1N CLK timing circuit 314 includes buffer 414. The 1N CLK timing circuit 314 further includes an adjustable delay control circuit 410 that is configured to compare the LCLK1N signal and DLLCLK1N signal, and provide an adjustable delay control signal DELADJ to the adjustable delay 406. The adjustable delay 406 may be adjusted based on the comparison to change the timing of the DLLCLK1N signal to a desired timing, for example, to satisfy a latency. The adjustable delay control circuit 410 may include a feedback delay, a phase detector, and adjustable delay control logic (not shown in FIG. 4) to compare the LCLK1N signal and DLLCLK1N signal and provide the DELADJ signal.

The 2N CLK timing circuit 312 includes an adjustable delay 401, which may include an adjustable coarse delay 402 and an adjustable fine delay 404. The coarse delay 402 may delay a clock signal by as much as a full 1N clock cycle. In the embodiment shown in FIG. 4, the DELADJ signal from the adjustable delay control circuit 410 is provided to the adjustable delay 401. The adjustable delay 401 and adjustable delay 405 may be controlled similarly by the DELADJ signal to provide the same adjustable delay. The 2N CLK timing circuit 312 further includes a buffer 412. The LCLK1N signal provided to the 1N CLK timing circuit 314 is delayed by the adjustable delay 405 and the buffer 414 to provide the DLLCLK1N signal. The LCLK2N signal provided to the 2N CLK timing circuit 312 is delayed by the adjustable delay 401 and the buffer 412 to provide the DLLCLK2N signal. The combination of the course delay element 412, the fine delay element 404 and the buffer 412 may be included in the 2N CLK timing circuit 312. The 1N timing circuit 314 may similarly be represented by the respective blocks 406, 408 and 414.

As previously described, the 2N CLK timing circuit 312 includes a buffer 412 and the 1N CLK timing circuit 314 includes a buffer 414. The buffers 412 and 414 of the 2N CLK timing circuit 312 and the 1N CLK timing circuit 314 have been illustrated in FIG. 4 to aid in understanding the delay block 320. The buffers 412 and 414 may represent intrinsic delays of the respective adjustable delays 401 and 405, and, for example, may be DLL delay block models. An intrinsic delay of an adjustable delay may include the delays of the coarse and fine delays when set adjusted to the minimum delays. While shown as separate delays in FIG. 4 from the adjustable delay, the intrinsic delay represented by the buffers 412 and 414 may be included in the adjustable delays 401 and 405, rather than being added to the forward delay as separate delay blocks. The buffer 310, however, is a delay circuit that is included in the signal path for the LCMDA and LCMDB signals that models the intrinsic delay of the adjustable delays 401 and 405. The buffer 310 may also delay any BA signals, previously delayed or otherwise, that may be associated with the LCMDA and LCMBB signals.

For the LCLK1N signal, the delay block 320 may add the intrinsic amount of delay along with the additional delay of the adjustable delay 405, the combination of which is the forward path delay, discussed above. The additional delay may include delay provided by the coarse delay 406 and the fine delay 408. The amount of delay added by the coarse and fine delays 406, 408 of the adjustable delay 405 may be based at least in part on a comparison of the LCLK1N and DLLCLK1N signals by the adjustable delay control circuit 410. As previously discussed, the adjustable delay control circuit 410 may include a feedback delay. The feedback delay of the adjustable delay control circuit 410 may be based on characteristics of downstream components/processes (not shown) of the memory, such as a DLL timing tree, a DQ tree, etc. As also previously discussed, the DELADJ signal from the adjustable delay control circuit 410 may be provided to both the adjustable delay 405 and the adjustable delay 401 so that the delay added by the adjustable delay 405 to the LCLK1N may be replicated by the course and fine delay elements 402, 404 for the LCLK2N signal. The LCMDA and LCMDB signals, along with any associated BA signals, are delayed by the buffer 310, which as previously discussed, models the intrinsic delay of the adjustable delays 401 and 405.

Figure 5:
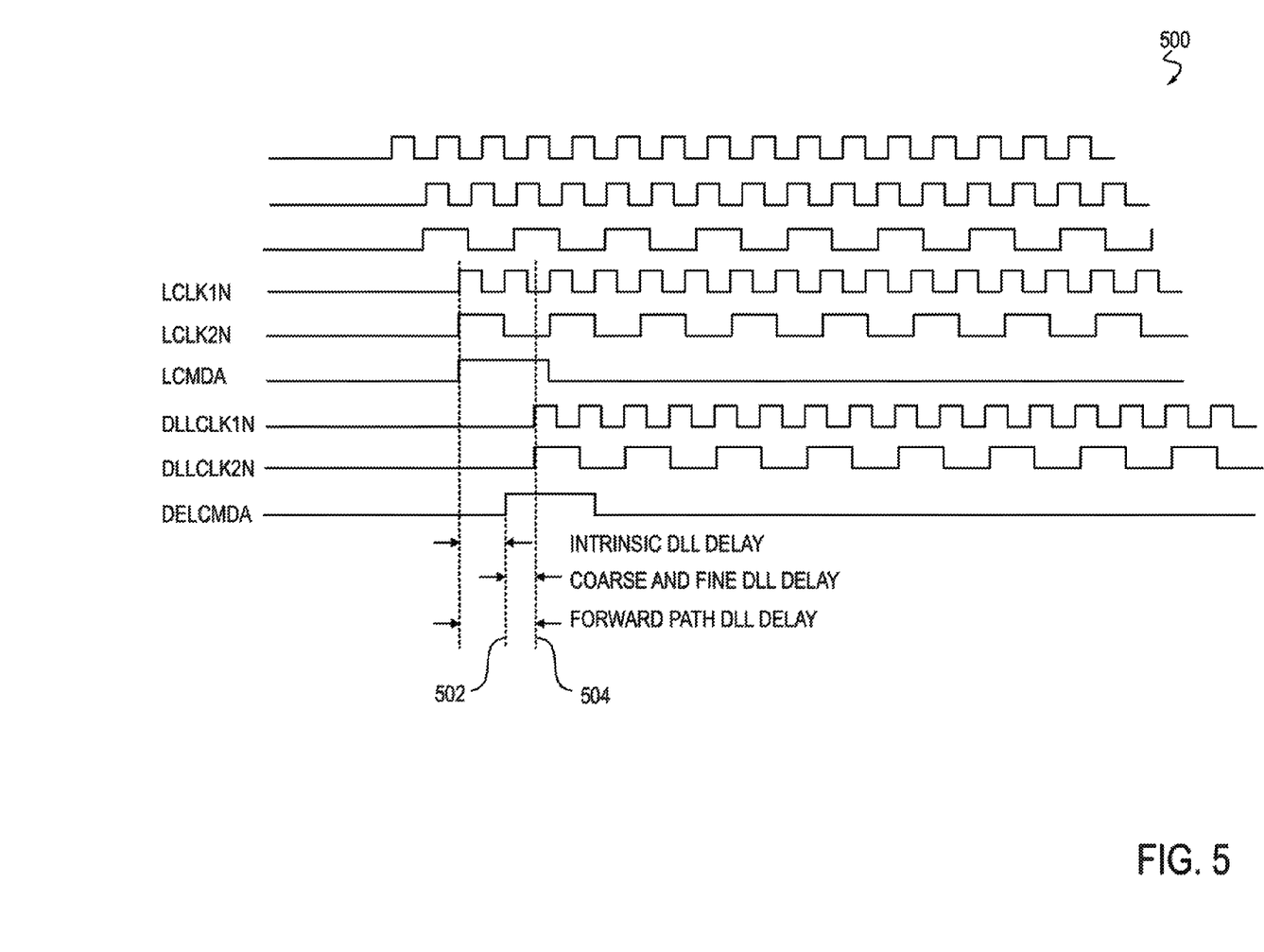
FIG. 5 is an example timing diagram for the delay block of FIG. 4 according to an embodiment as discussed herein.

FIG. 5 shows an example timing diagram 500 of the delay block of FIG. 4 in accordance with the disclosure discussed herein. The timing diagram 500 shows the signal waveforms for the inputs to the delay block 320, which are command signals LCMDA (LCMDB would show similar characteristics and so for brevity only the LCMDA signal is shown), LCLK1N, and LCLK2N. The waveforms for the outputs of the delay block 320 are the DLLCLK1N, DLLCLK2N and the DELCMDA. As discussed above, the 2N clock signal is half the clock cycle (twice the period) as the 1N clock signal. The 2N clock signal is used as an internal clock reference for the operation of the memory and the timing circuits as discussed herein. Further, the CMD signal, which is originally based on the 1N clock, is transferred to the 2N clock base by providing a CMD signal that is active for a time equal to one clock period of the 2N clock signal. The transfer of the CMD signal to the 2N clock base may result in stretching it to twice its original period. For example, if the CMD signal for a read operation is provided for a full period of the 1N clock, then the CMD signal will be active for a full period of the 2N clock after transfer to the 2N clock base. This change is represented by comparing the three input signals LCLK1N, LCLK2N and LCMDA shown in timing diagram 500. These three input signals to the delay block 320 of FIG. 4 have already been partially delayed as described in reference to FIG. 3.

As noted above, the LCLK1N signal, LCLK2N signal, and LCMDA signal provided to the delay block 320 are edge aligned by the prior circuits/blocks, for example, the latency timing block 304 and the latency timing block model 308. As the clock and command inputs propagate through the delay block 320 they may incur different amounts of delay. The LCMDA signal may only be delayed by the buffer (e.g., a DLL delay block model) whereas the two clock signals may be delayed the intrinsic delay amount plus an adjustable delay amount. At output, the two clock signals DLLCLK1N and DLLCLK2N may be edge aligned but may not be aligned to the DELCMDA signal.

The resynchronization circuit 106, coupled to the delay block 320, may instruct output drivers/buffers to release data upon the DELCMDA and DELCMDB signals, and the DLLCLK1N and DLLCLK2N signals simultaneously being high. As shown in the timing diagram 500, the DELCMDA (and B) signal may rise high before the two clock signals due to the command signal being delayed less than the two clock signals. However, since the DELCMDA signal is high for a full 2N clock cycle and the maximum adjustable delay of the adjustable delay is typically less than a full 1N clock cycle, the two clock signals will rise high while the DELCMDA is high. Thus, the resynchronization circuit will be activated. For example, if the DELCMDA signal rises high at 502 after being delayed by a buffer and the DLLCLK1N and DLLCLK2N signals rise high at 504, then the resynchronization circuit 106 will provide ACTCMDA and ACTCMDB signals. Since the maximum additional delay the clock signals experience is less than a 1N clock cycle and the DELCMDA signal is high for a full 2N clock cycle, then the command and clock signals may all be high at some point before the DELCMDA signal falls low. The lack of the additional delay added to the DELCMDA signals may not affect the performance of the timing circuit, such as the timing circuit 300.

The lack of including the course and fine delay elements for the command lines in the delay block may save space, and reduce both power consumption and noise level. A conventionally high speed memory may have 20 to 40 command lines, which would all need the adjustable delay and the additional traces for connection. Omitting the additional circuitry and traces may result in area, power and noise savings. The lack of those circuit and trace elements may also reduce circuit layout complexity.

Figure 6:
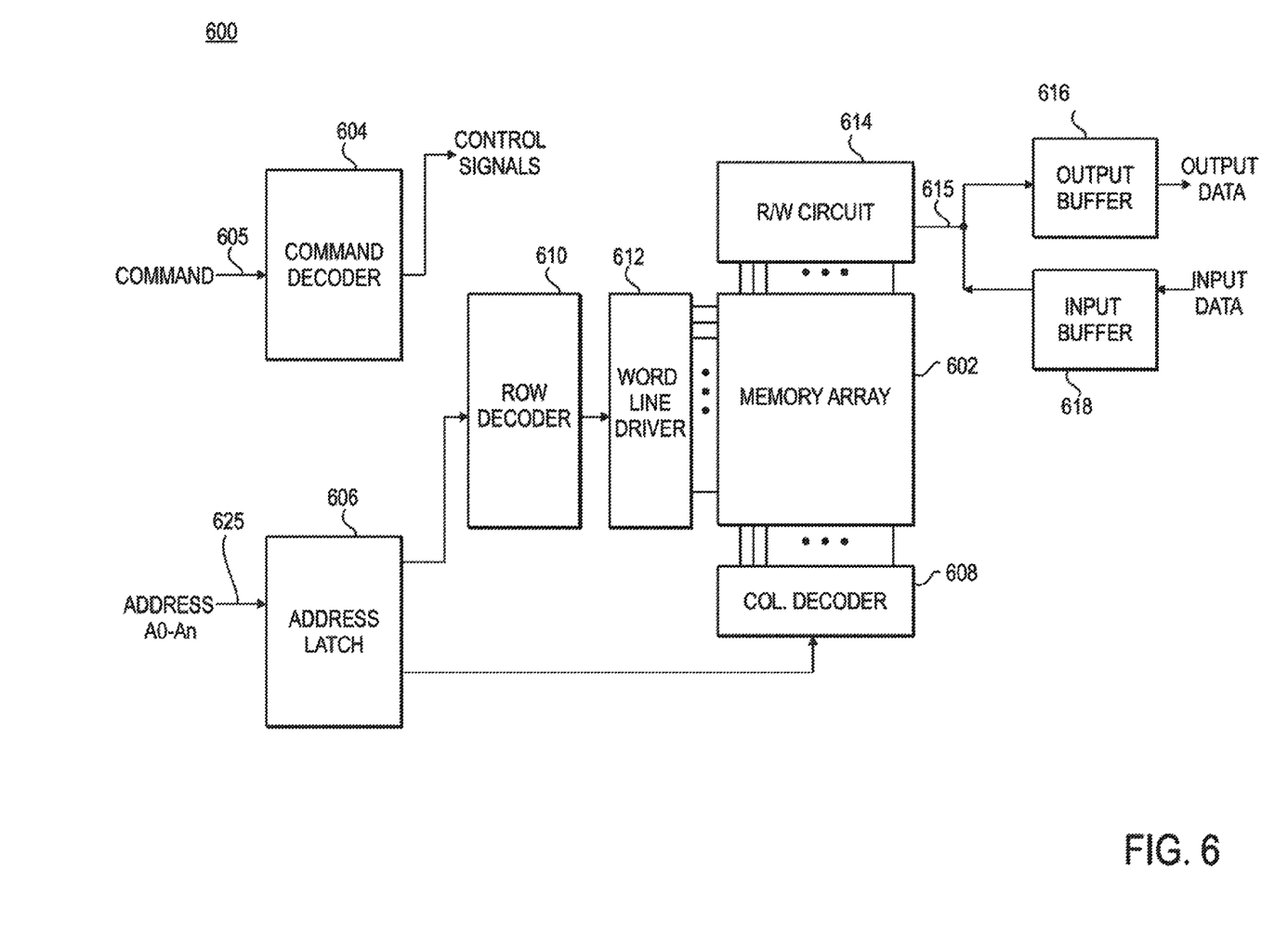
FIG. 6 illustrates a memory including a timing circuit according to an embodiment as discussed herein.

FIG. 6 illustrates a memory 600 including a timing circuit according to an embodiment as discussed herein. The memory 600 includes an array 602 of memory cells, which may be, for example, volatile memory cells (e.g., DRAM memory cells, SRAM memory cells), non-volatile memory cells (e.g., flash memory cells), or some other types of memory cells. The memory system 600 includes a command decoder 604 that receives memory commands through a command bus 605 and generates corresponding control signals within the memory system 600 to carry out various memory operations. The command decoder 604 responds to memory commands applied to the command bus 605 to perform various operations on the memory array 602. For example, the command decoder 604 is used to generate internal control signals to read data from and write data to the memory array 602. Row and column address signals are applied to the memory system 600 through an address bus 625 and provided to an address latch 606. The address latch then outputs a separate column address and a separate row address.

The row and column addresses are provided by the address latch 606 to a row address decoder 610 and a column address decoder 608, respectively. The column address decoder 608 selects bit lines extending through the array 602 corresponding to respective column addresses. The row address decoder 610 is connected to word line driver 612 that activates respective rows of memory cells in the array 602 corresponding to received row addresses. The selected data line (e.g., a bit line or bit lines) corresponding to a received column address are coupled to a read/write circuitry 614 to provide read data to a data output buffer 616 via an input-output data bus 615. Write data are applied to the memory array 602 through a data input buffer 618 and the memory array read/write circuitry 614.

The timing circuit included in the command decoder 604 is configured to generate the command lines for reading from and writing to the memory array 602 in accordance to a latency. The timing circuit may include two separate clock paths and the clock signals propagating through those two paths, in some embodiments, may be of a different clock frequency. The timing circuit 630 at various stages may add latency to command, address and clock signals and may also align the signals so that they simultaneously arrive at their final destination. However, the clock signals may receive fine and course delay plus some intrinsic delay whereas the command/address signals may only receive the intrinsic delay. By not including the course and fine delay elements for the command lines in the delay block, space may be saved and reductions in both power consumption and noise level may be realized. Omitting the additional circuitry and traces may result in area, power and noise savings. The lack of those circuit and trace elements may also reduce circuit layout complexity.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

What is claimed is:

1. An apparatus, comprising:
    a latency timing block circuit configured to align a command signal and/or a bank address signal with a first clock signal;
    a latency timing block model circuit configured to align a second clock signal to the first clock signal and the command signal and/or the bank address signal;
    a delay block configured to receive the command signal and/or the bank address signal and the first clock signal from the latency timing block circuit, and to receive the second clock signal from the latency timing block model circuit, the delay block comprising a buffer configured to add an intrinsic delay to the command signal or the bank address signal, and a first timing circuit and a second timing circuit configured to add a forward path delay greater than the intrinsic delay to the first and second clock signals, respectively.

2. The apparatus of claim 1, wherein the forward path delay is a combination of the intrinsic delay and an adjustable delay.

3. The apparatus of claim 2, wherein the intrinsic delay comprises a minimum adjustable delay.

4. The apparatus of claim 2, the adjustable delay comprises an adjustable coarse delay and an adjustable fine delay.

5. The apparatus of claim 2, wherein a maximum adjustable delay is less than a clock cycle of the second clock signal.

6. The apparatus of claim 1, wherein the first clock signal is a derivative of the second clock signal.

7. The apparatus of claim 6, wherein a clock cycle of the first clock signal is twice a clock cycle of the second clock signal.

8. The apparatus of claim 6, wherein the command signal includes an active time that is equal to a clock cycle of the first clock signal.

9. The apparatus of claim 1, wherein the command signal is delayed less than the first and second clock signals.

10. The apparatus of claim 1, wherein the delay block outputs a delayed command signal, a delayed first clock signal, and a delayed second clock signal, wherein the delayed first and delayed second clock signals are aligned.

11. The apparatus of claim 1, wherein the apparatus may be circuitry, a memory device, or a system including a memory device.

12. The apparatus of claim 1, further including a resynchronization circuit configured to receive a delayed command signal or a delayed address signal, a delayed first clock signal and a delayed second clock signal and further configured to synchronize the delayed command and/or address signals with the delayed first and second clock signals to provide output activation signals.

13. A method, comprising:
    propagating a command signal through a delay locked-loop (DLL) delay model;
    delaying using a DLL a second clock signal by a forward path delay including an intrinsic delay, wherein the DLL delay model models the intrinsic delay and the forward path delay is greater than the intrinsic delay;
    delaying a first clock signal by the forward path delay;
    receiving the command signal and the first clock signal from a latency timing block configured to align the command signal and the first clock signal; and
    receiving the second clock signal from a latency timing block model configured to align the second clock signal to the first clock signal and the command signal.

14. The method of claim 13, wherein delaying the first clock signal and the second clock signal by the forward path DLL delay comprises:
    delaying the first clock signal and the second clock signal by the intrinsic DLL delay;
    delaying the first clock signal and the second clock signal by a coarse delay; and
    delaying the first clock signal and the second clock signal by a fine delay.

15. The method of claim 14, wherein the coarse delay and the fine delay are adjustable.

16. The method of claim 13, wherein the command signal comprises a first command signal and a second command signal out of phase with the first command signal.

17. The method of claim 13, wherein a clock cycle of the first clock signal is twice a clock cycle of the second clock signal.

18. The method of claim 13, further comprising:
    synchronizing the delayed command signal and the delayed first and second clock signals; and
    providing output strobe signals based, at least in part, on the delayed command signal and the delayed first and second clock signals.

19. An apparatus, comprising:
    a command path circuit coupled to a command/address node and a first clock node and configured to at least align a command or address signal and a first clock signal;
    a clock path circuit coupled to a second clock node and configured to replicate a latency of the command path circuit on a second clock signal;
    a delay block coupled to the command path circuit and the clock path circuit and configured to delay the first and second clock signals by a forward path delay and further configured to propagate the command or address signal and provide a delayed command or address signal, a delayed first clock signal and a delayed second clock signal, wherein the delay block is further configured to align the delayed first clock signal and the delayed second clock signal.

20. The apparatus of claim 19, wherein the delayed command or address signal is delayed by an intrinsic delay associated with the forward path delay.

21. The apparatus of claim 19, further comprising a clock divider and timing circuit coupled to the second clock node and configured to provide the first clock signal based on the second clock signal, wherein a period of the first clock signal is greater than a period of the second clock signal.

22. The apparatus of claim 19, wherein the command signal comprises a pair of out of phase command signals.

23. The apparatus of claim 22, further comprising a dual phase clock circuit coupled to the command node and the first clock node and configured to provide the pair of out of phase command signals based on a period of the first clock signal and further coupled to the command path circuit.

24. The apparatus of claim 19, wherein the apparatus is one of a memory device, a computing system including a memory device or circuitry.

* * * * *